United States Patent [19]

Nam et al.

[11] Patent Number: 5,703,816
[45] Date of Patent: Dec. 30, 1997

[54] FAILED MEMORY CELL REPAIR CIRCUIT OF SEMICONDUCTOR MEMORY

[75] Inventors: Hyo-Yun Nam; Young-Ho Suh, both of Kyungki-do, Rep. of Korea

[73] Assignee: Samsung Electronics Co., Ltd., Suwon, Rep. of Korea

[21] Appl. No.: 672,619

[22] Filed: Jun. 28, 1996

[30] Foreign Application Priority Data

Jun. 28, 1995 [KR] Rep. of Korea ............... 17840/1995

[51] Int. Cl.[6] .................................................. G11C 7/00
[52] U.S. Cl. .......................... 365/200; 365/201; 365/203; 365/225.7
[58] Field of Search ............................ 365/200, 201, 365/190, 203, 225.7

[56] References Cited

U.S. PATENT DOCUMENTS 4,587,639  5/1986  Aoyama et al. ................ 365/200
4,639,895  1/1987  Iwahashi et al. ............... 365/200
5,414,668  5/1995  Nakashima et al. .......... 365/225.7
5,500,823  3/1996  Martin et al. .................... 365/201
5,548,555  8/1996  Lee et al. ......................... 365/200
5,577,051 11/1996  McClure .......................... 371/21.4

*Primary Examiner*—David C. Nelms
*Assistant Examiner*—Hien Nguyen
*Attorney, Agent, or Firm*—Marger, Johnson, McCollom & Stolowitz PC

[57] ABSTRACT

In semiconductor memory devices, failed memory cells are problematic because they draw excessive standby currents. To repair such devices before packaging, the failed memory cell columns are replaced by redundant columns. To ensure that a replaced column having a failed cell does not draw excessive standby current, the invention provides for turning off the precharge circuit transistor pair that otherwise would supply precharge current to the bit line pair in the defective column, and also turning off the cell power line circuit that otherwise would supply current along a cell power line to the cell power nodes in the defective column of the memory array.

4 Claims, 5 Drawing Sheets

FAILED MEMORY CELL REPAIR CIRCUIT OF SEMICONDUCTOR MEMORY

BACKGROUND OF THE INVENTION

1. Field of the Invention

The present invention relates to design and manufacture of semiconductor memory devices and, more specifically, to repair of failed memory cells detected during the manufacturing process. At the wafer stage, failed memory cells, i.e. those having excessive standby currents, are detected and replaced by redundant cells using a failed memory cell repair circuit. The present application is based upon Korean Application No. 17840/1995, which is incorporated herein by reference.

2. Description of the Related Art

In general, in static random access memories (SRAMs), one of the primary causes of reduced production yield is standby current failure, i.e. circuits that draw excessive standby current. Particularly as semiconductor memory capacity increases, and thus the number of memory cells increases, the typical cell standby current value is equal to or lower than a conventional standby current. When a chip is detected as exhibiting a standby current failure at the wafer stage, failed cells within the chip are replaced by redundant cells.

In SRAM, a standby current failure generally can be traced to failure in a memory cell array, or in a peripheral circuit. First, in the peripheral circuits, the standby current failure results from excessive leakage current of active devices such as transistors within the peripheral circuits. Or such failures can result from misconnection of internal connecting devices in the peripheral circuits. Accordingly, even if the standby current failure results from a temporarily abnormal process, or from an external factor such as an impurity, the failed circuit within the peripheral circuitry must be replaced by a normal circuit. If, however, redundant peripheral circuits or redundant internal connecting devices are not provided, such replacement is impossible and the device cannot be repaired.

Second, the case where the standby current failure occurs within the memory cell array will be explained with reference to FIG. 1. FIG. 1 is a circuit diagram illustrating a memory cell structure in a typical static random access memory. In a memory cell 30, nodes connected to current sources which may generate the standby current failure are bit line pair BL and BLb (nodes 32 and 33, respectively) and a cell power node 31. Since the node 31 receiving the cell power is connected to a high resistance load or a current limit means, an extremely limited data maintaining current is supplied to cell nodes CD and CDb (34 and 35 appearing at the drain terminals of access transistors 36 and 37, respectively.) Moreover, the current sources connected to the bit line pair BL and BLb nodes 32 and 33 are supplied to the bit lines by the precharge circuit 20 for maintaining the bit lines at a given voltage in a standby state. Where the current source flowing to the bit lines causes the standby current failure, a circuit diagram for repairing the standby current failure is shown in FIG. 2, which is disclosed in U.S. Pat. No. 4,587,639.

FIG. 2 is a circuit diagram illustrating a standby current failure memory cell repair circuit, which is useful where the current sources connected to the bit lines (i.e., the bit line precharge circuit 20) causes the standby current failure. A repair circuit 50 includes a series of fuses, e.g. FI 1, each connected between one terminal of a high resistivity load and a ground potential. Each fuse is connected to a corresponding column in the precharge circuit 20. The repair circuit 50 selectively disables the current sources supplying current to memory cells 30. Specifically, the repair circuit disables the current sources, e.g. M11, M12 that supply current to the column of the array in which a standby current failure occurs. Shutting off the precharge current source prevents abnormal standby current from flowing through the failed column. Of course, the failed column can be replaced by an available redundant column. The circuit in FIG. 2 is different from the typical failed cell repair circuit in that the bit line precharge circuit 20 positioned in the failed column is turned off by the circuit 50.

To illustrate, if the column 11 is determined to have a standby current failure, the fuse F11 connected to the gates of transistors M11 and M12 within the precharge circuit 20 of the column 11 is blown open. This results in a logic "high" level applied to the gates of the bit line precharge circuit 20 corresponding to the failed column, so transistors M11 and M12 are turned off. Accordingly, the current supply to the bit lines of column 11 is stopped.

However, while the circuit of FIG. 2 prohibits the operation of the bit line precharge circuit 20 in the failed column, there remains a problem in that a standby current failure occurring at an individual cell power node (31 of FIG. 1) can continue to draw current. Therefore, in order to solve this problem, another prior art standby current cell repair circuit 60 is shown in FIG. 3, and disclosed in U.S. Pat. No. 4,639,895. Referring now to FIG. 3, another standby current failed cell repair circuit 60 includes a series of transmission transistors, each of which transmits a supply voltage in response to a common control signal Pb of a logic "low" state, and a series of fuses, e.g. fuse F21, each connected in series between a respective one of the transmission transistors and a corresponding one of the cell power lines. Each transmission transistor provides supply power to the corresponding row of memory cells as long as the corresponding fuse remains in met. Repair circuit 60 thus separates cell power lines within the memory cell array by individual rows, or by a specific number of rows, and connects the cell power lines together along each such row. When cell power supplied to a standby current failed memory cell (or the row having the cell) is cut off, the cell(s) no longer draw current at the cell power node. For example, when the row 21 is determined to have a standby current failure, the supply of cell power connected to the memory cells along the row is stopped by blowing open the corresponding fuse F21.

The circuits of FIGS. 2 and 3, however, do not entirely resolve the standby current failure problem. The repairing operation of FIG. 2 is executed by columns, and addresses only excessive bit line precharge current. The repairing operation of FIG. 3, on the other hand, is executed by row and remedies only excessive cell power node current. Neither approach ensures that all standby current failures are resolved. Moreover, if repairing operations are simultaneously executed in both row and column directions, double repairing operations are required and double fuses and repairing circuits must be provided in the memory device. Such a design of a memory device results in unduly complicated structure and the product yield therefore may he accordingly reduced.

SUMMARY OF THE INVENTION

Accordingly, it is an object of the present invention to provide a failed memory cell repairing circuit that overcomes the aforementioned limitations.

It is another object of the present invention to provide a failed memory cell repairing circuit which is capable of repairing a failed memory cell in one or more columns of the array where a detected failure is related to excessive standby current at a cell power node, as distinguished from a failure in the bit line precharge circuit or peripheral circuits.

It is a further object of the present invention to cut off both cell power node standby current as well as bit line precharge current in a failed column of memory cells.

To accomplish these and other objects, a failed memory cell repair circuit in a semiconductor memory having a plurality of memory cells, each of the memory cells including a resistor load terminals connected through a resistor or a current limiting means, a pair of access transistors which has drain terminals connected to the resistor load terminals, gate terminals connected to a word line, and source terminals connected to a pair of bit lines, and a pair of drive transistors having gate terminals cross-coupled to the drain terminals of the, access transistors, and a plurality of precharge transistor pairs for precharging the bit line pair in unit of column direction, includes a current cutoff device for converting a cell power provided through the resistor load terminals to the memory cells into a ground potential and cutoff a current supply to the precharge transistors, when the memory cells disposed in the unit of column direction are determined to he as standby current failed memory cells.

In a preferred embodiment of the present invention, a current cutoff circuit (or "fuse circuit") includes a resistor and a fuse device serially connected between the cell power source and a ground potential. A first inverter has an input terminal connected to a connecting point between the resistor and the fuse device, and an output terminal connected to the corresponding column cell power line. The cell power line is connected to the cell power nodes of all the cells in the corresponding column. While the fuse is in tact, the inverter provides a high voltage to supply current to the cell power line. Where a memory cell failure is detected, the corresponding column fuse is blown open, and the resistor pulls up the fist inverter input node so that the output terminal provides the ground potential to the cell power line, i.e. to the cell resistor load terminals, thereby cutting off current to the cells power nodes. A second inverter is connected to the output terminal of the first inverter, for providing a control voltage to the gate terminals of the precharge transistor pair so as to turn off the precharge transistor pair in the offending column when the first inverter outputs the ground potential. In this way, both the bit line current and the cell power current are cut off in the failed cell column, while repair circuitry is minimized.

In another preferred embodiment of the present invention, the current cutoff circuit includes a resistor and a fuse device serially connected between the cell power and a first node. A logic device having an output terminal is connected to the first node, one input terminal of the logic device is connected to receive an external selection signal, and the other input terminal is connected to receive a first internal selection signal, for determining a standby current failed memory cell in response to the first internal and/or external selection signals, as further explained later. A second logic device has an input terminal connected to a connecting node between the resistor and the fuse device, so as to provide the ground potential to the resistor load terminals (i.e. the cell power nodes) when the fuse device is blown open, i.e. when the corresponding memory cells are identified as the failed memory cells. A third logic device has one input terminal connected to an output terminal of the second device, and another input terminal connected to receive a second internal selection signal, for controlling the gate terminals of the precharge transistor pair. When the second device outputs a ground potential, the third device supplies a predetermined voltage to the gate terminals of the precharge transistor pair so as to turn them off, i.e cut off the bit line precharge currents. The first logic device preferably comprises a NOR gate, the second logic device comprises an inverter, and the third logic device comprises a NAND gate.

BRIEF DESCRIPTION OF THE DRAWINGS

A more complete appreciation of this invention, and many of the attendant advantages thereof, will become apparent as the same becomes better understood by reference to the following detailed description when considered in conjunction with the accompanying drawings, in which like reference symbols indicate the same or similar elements components, wherein.

DETAILED DESCRIPTION OF THE PREFERRED EMBODIMENT

Figure 1:
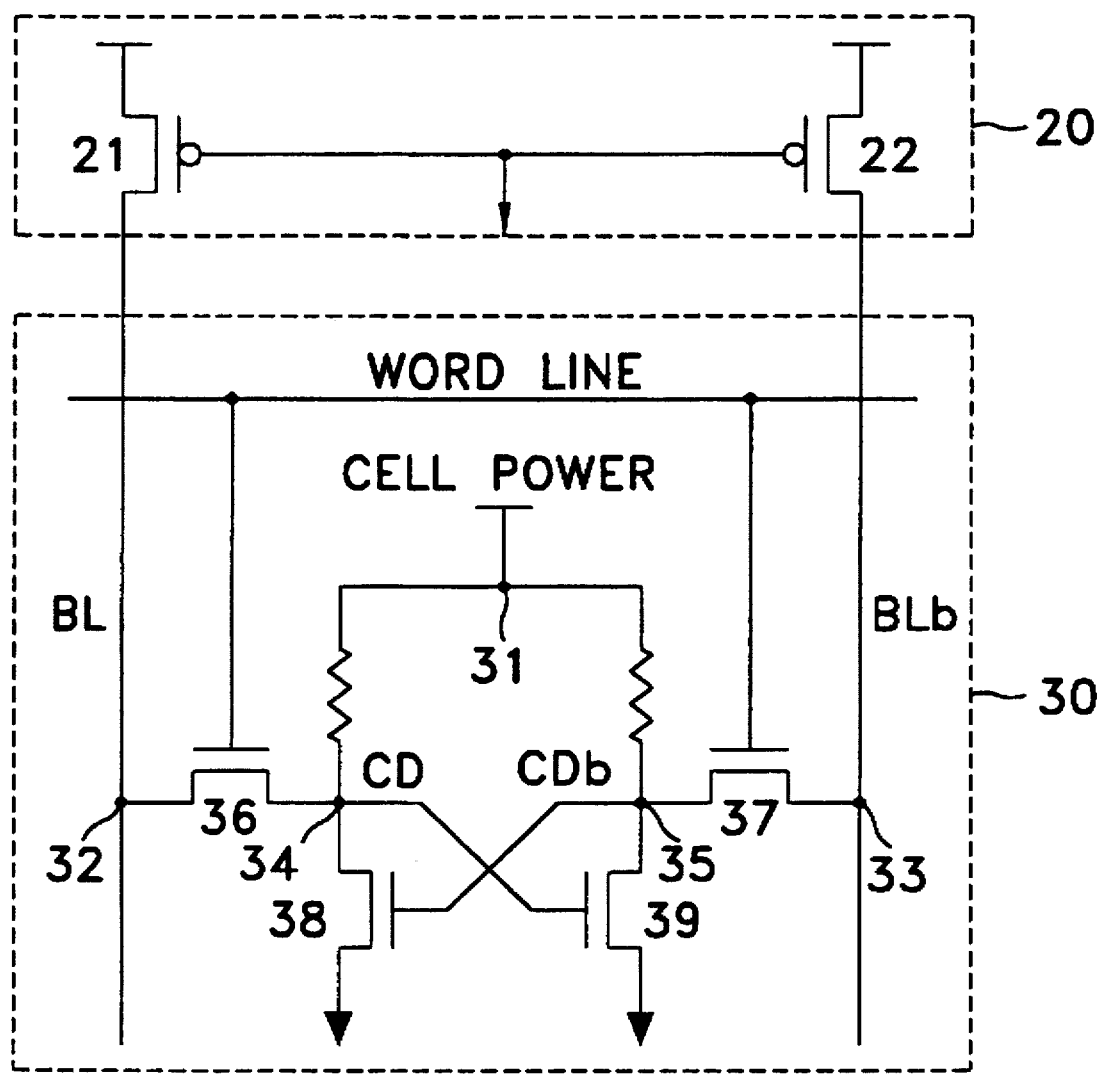
FIG. 1 is a circuit diagram illustrating a structure of a memory cell in a typical static random access memory.
Figure 2:
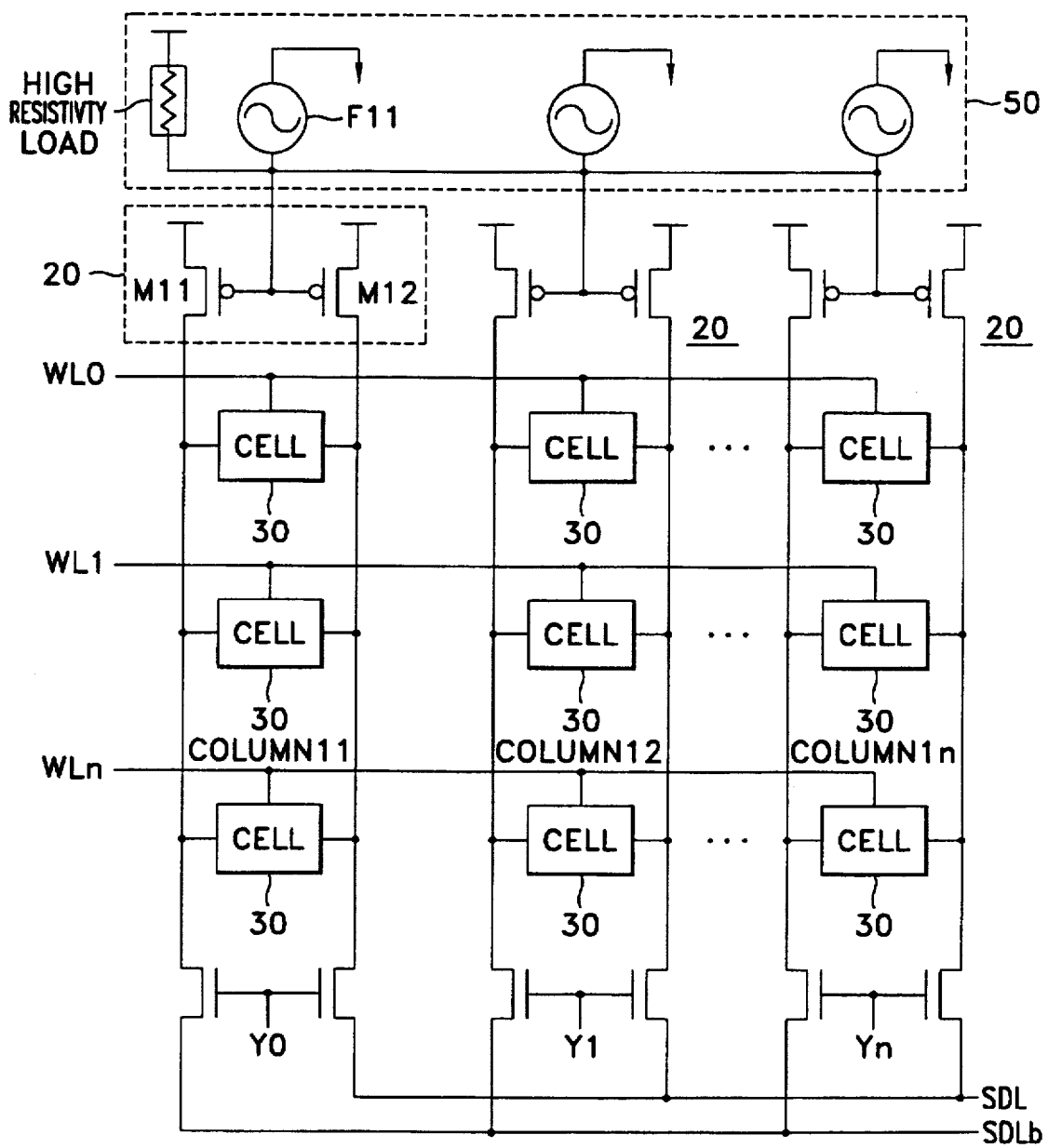
FIG. 2 is a circuit diagram illustrating a standby current failed cell repair circuit in a conventional memory device.
Figure 3:
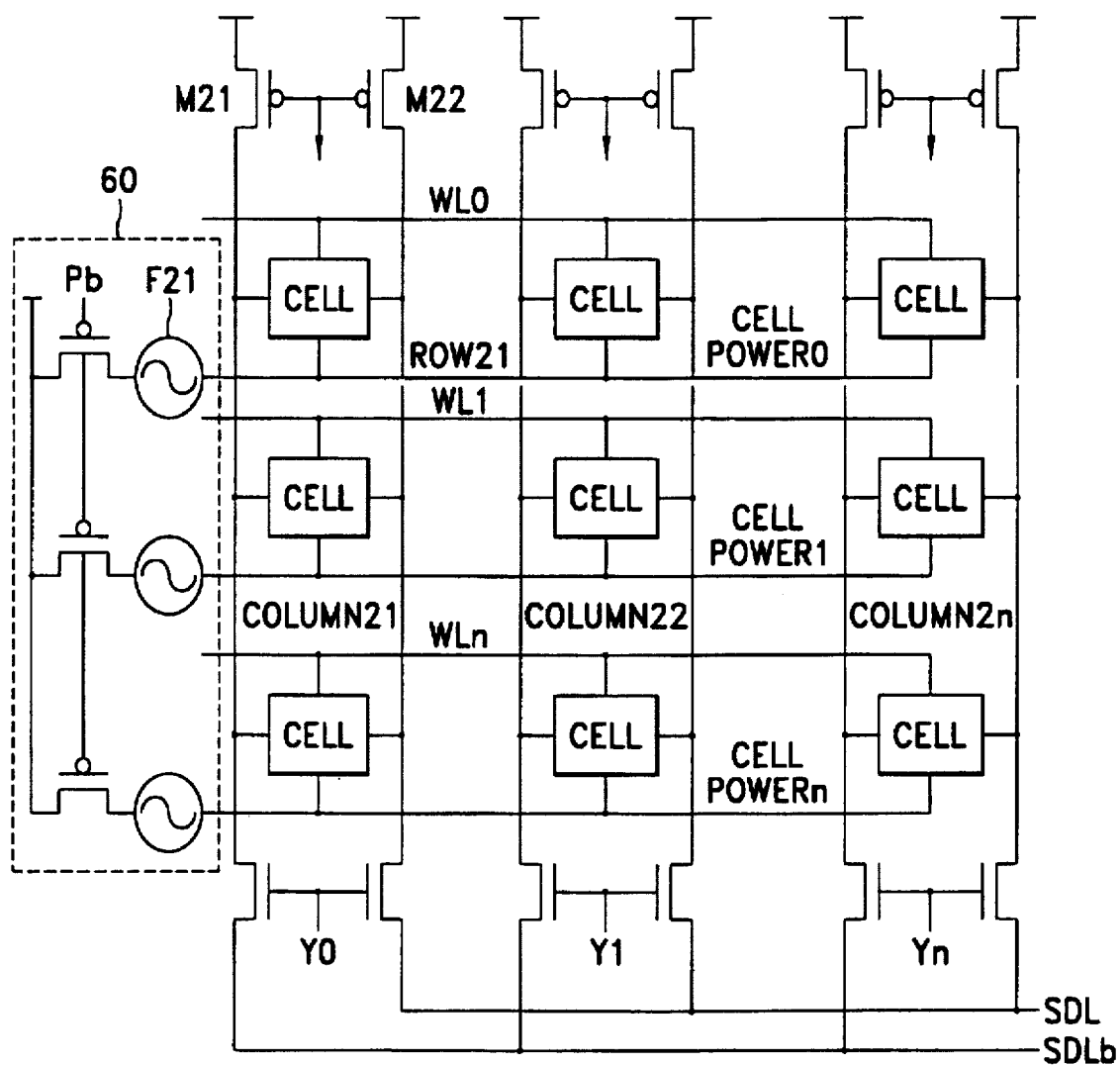
FIG. 3 is a circuit diagram illustrating a standby current failed cell repair circuit in another conventional memory device.

It should he noted that like reference numerals are used for like elements or parts even though they may he displayed in a separate drawing. Further, in the following description, numerous specific details such as particular components and algorithms for the specific circuits are set forth to provide a more thorough understanding of the present invention. It will he apparent, however, to one skilled in the art that the present invention may he practiced without these specific details. Furthermore, the detailed description of known functions and construction details unnecessarily obscuring the subject matter of the present invention is avoided in the following description.

While the present invention will been particularly shown and described in the following detailed description, it will he understood by those skilled in the art that various changes in form and details may he effected therein without departing from the spirit and scope of the present invention. In particular, while the present invention is illustrated with respect to a high density SRAM, it is possible to adapt the present invention to other memories. Therefore, it should he understood that the present invention is not limited to the specific embodiments described in this specification.

Figure 4:
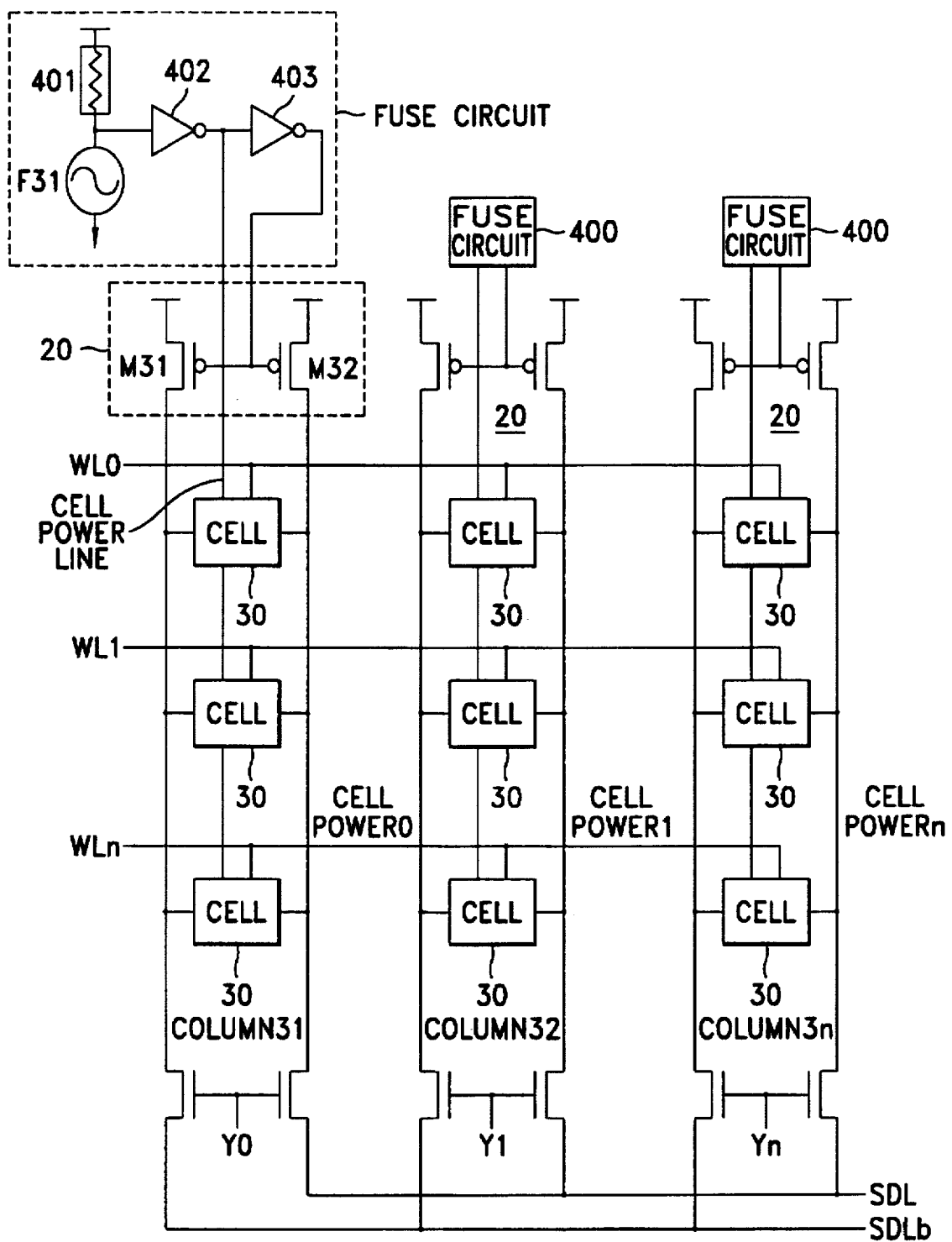
FIG. 4 is a circuit diagram illustrating a standby current failed cell repair circuit according to one embodiment of the present invention.
Figure 5:
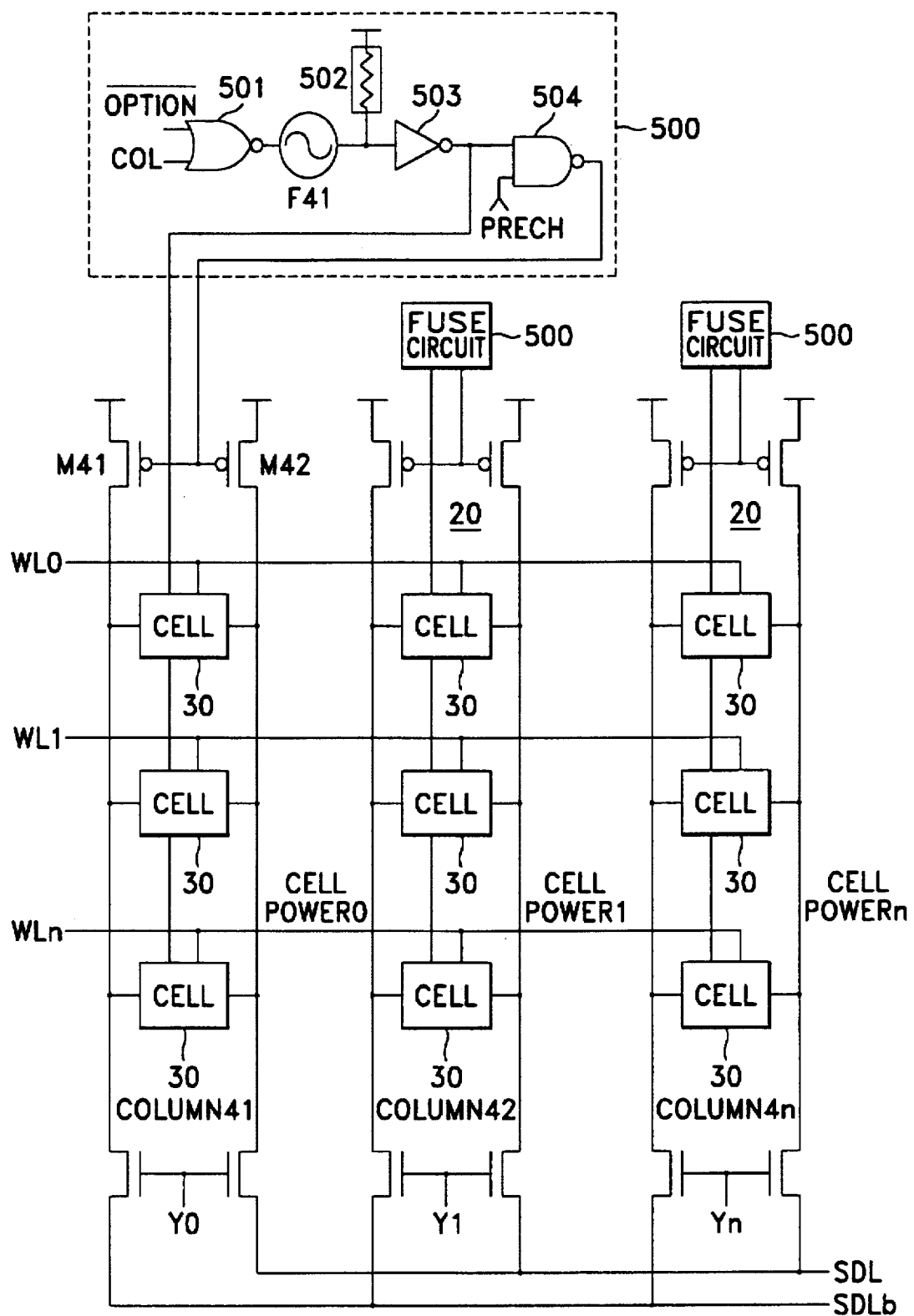
FIG. 5 is a circuit diagram illustrating a standby current failed cell repair circuit according to another embodiment of the present invention.

FIG. 4 is a circuit diagram illustrating a standby current failed cell repair circuit according to one embodiment of the present invention, and FIG. 5 is a circuit diagram illustrating a standby current failed cell repair circuit according to another embodiment of the present invention.

Referring first to FIG. 4, the cell power supplied to each memory cell 30 in a column of the memory array is connected to a fuse circuit 400 through a common cell power line. (The cell power node internal connection is shown in FIG. 1 .) The fuse circuit 400 implements a current cutoff device as follows. The fuse circuit 400 includes a resistor 401 and a fuse F31 connected in series between a cell power supply source and a ground potential. A first inverter 402 has an input terminal connected to the common node intermediate the resistor 402 and the fuse F31. In operation, while the fuse is in tact, the common node is pulled down to ground, and the inverter 402 outputs a high signal providing cell power to the cell power line. If and when a standby current failure is detected, the fuse F31 is blown open, and the common node is pulled high, so that the inverter 402 outputs a logic low or ground potential to the cell power nodes, ie. the cell resistor load terminals. A second inverter 403 has an input connected to the output terminal of the first inverter 402. The second inverter output terminal is connected to the column precharge circuit 20, ie. to the gates of transistors M31 and M32, so as to turn off the transistors when inverter 402 goes low. Thus the fuse circuit rams cuts off the cell power line current, and cuts off the precharge circuit as well, of a column in which a standby current failure has been detected. Similar fuse circuits 400 are provided for each column of the array as indicated in FIG. 4.

Consequently, the column of the array in which the standby current failure occurs is electrically isolated from the current source and hence no longer exhibits excessive standby current drain. The isolated column is replaced by a redundant column. The particulars of such replacement are known to those skilled in the art, and hence are omitted here.

Referring next to FIG. 5, an alternative fuse circuit 500 includes a resistor 502 and a fuse F41 connected to each other at a common node. The resistor is arranged to pull up the common node to a cell power supply node. A NOR logic gate 501 has an output terminal connected to the fuse F41, one input terminal connected to an external selection signal COL, and the other terminal connected to a first internal selection signal/OPTION. Thus, when either selection signal goes high, the NOR output goes low, pulling the common node down substantially to ground, provided the fuse is in tact (conductive). An inverter 503 has an input terminal connected to the common node between the resistor 502 and the fuse F41, and has its output connected to the corresponding column cell power line. When the fuse F41 is open, the common node goes high, and the output of inverter 503 goes low, thus providing substantially a ground potential to the resistor load terminals—i.e. the cell power nodes—by the blowing of the fuse F41, in the case where the memory cells are identified as standby current failed cells.; and a NAND gate 504 having one input terminal connected to an output terminal of the inverter 503 and the other input terminal connected to an internal selection signal, for providing the cell power to the gate terminals of the precharge transistor pair M41 and M42, in the case where the inverter 503 outputs the ground potential and for providing a given voltage to the gate terminals of the precharge transistor pair M41 and M42 in response to the second internal selection signal, in the case where the inverter 503 outputs the cell power.

In FIG. 5, the column is electrically cut from the current source by the external selection signal as well as the fuse device. Further, an arbitrary column is electrically connected to the current source by the internal selection signal COL regardless of the external selection signal state. The external selection signal is a mode selection signal for implementing a specific test. The internal selection signal COL can use a column address decoding signal. In other words, when the external selection signal and the internal selection signal COL are at ground potential levels, all of the columns are then electrically cut from the current source. Then, the cell power is applied to the signal COL of a selected column and only the selected column is connected to the current source. In this way, the column select circuitry (not shown) can be used to survey the device to locate a column that exhibits excessive standby current—ie. a failed column—simply by stepping through all of the array column addresses so that the COL internal selection signals are asserted one at a time. As discussed in the above, the present invention is advantageous in that a standby current failure attributable to a cell power node is avoided, and operation of the failed cell is terminated as to the bit line current source as well.

While the present invention has been described above with reference to the preferred embodiment, it will be appreciated by those skilled in the art that various substitutions and modifications can be made without departing from the spirit and scope of the invention as set forth in the following claims.

What is claimed is:

1. A failed memory cell repair circuit for use in a semiconductor memory having a plurality of memory cells, each of said memory cells including resistor load terminals connected through current limiting means, a pair of access transistors having drain terminals connected to said device load terminal, gate terminals connected to a word line, and source terminals connected to a pair of bit lines, and a pair of drive transistors having gate terminals cross-coupled to said drain terminals of said bit line pair in unit of column direction, said circuit comprising:

a first current cutoff means for cutting off a cell power provided to said memory cells in a selected column of the array through a cell power line; and a second current cutoff means for cutting off the pair of precharge transistors that supply bit line pair precharge current to the cells in the selected column;

wherein said first current cutoff means is comprised of a resistor and a fuse sequentially connected between the cell power and the ground potential;

and includes a first inverter having an input terminal connected to a connecting point between the resistor and the fuse, for providing the ground potential to the resistor load terminals by blowing of the fuse, in the case where the memory cells are standby current failed cells, and the second current cutoff means is connected to the first cutoff means so as to simultaneously cut off the power supply to the memory cells and the current supply to said precharge transistors, and said second current cutoff means comprises a second inverter connected to an output terminal of the first inverter, for providing a voltage level approximating the cell power to the gate terminals of the precharge transistor pair, in the case where the first inverter outputs the ground potential.

2. A failed memory cell repair circuit for use in a semiconductor memory having a plurality of memory cells, each of said memory cells including resistor load terminals connected through current limiting means, a pair of access transistors having drain terminals connected to said device load terminal, gate terminals connected to a word line, and source terminals connected to a pair of bit lines, and a pair of drive transistors having gate terminals cross-coupled to said drain terminals of said access transistors, and a plurality of precharge transistors pairs for precharging said bit line pair in unit of column direction, said circuit comprising:

- a first current cutoff means for cutting off a cell power provided to said memory cells in a selected column of the array through a cell power line; and
- a second current cutoff means for cutting off the pair of precharge transistors that supply bit line pair precharge current to the cells in the selected column;

wherein said first current cutoff device comprises:

- a resistor and a fuse serially connected to each other;
- a first device having an output terminal connected to the fuse, one input terminal connected to an external selection signal, and the other terminal connected to a first internal selection signal, for determining a standby current failed cell in response to the first internal and/or external selection signals;
- a second device having an input terminal connected to a connecting node between the resistor and the fuse, for providing the ground potential to the resistor load terminals by blowing of the fuse, in the case where the memory cells are determined as the standby current failed memory cells; and
- a third device having one input terminal connected to an output terminal of the second device and the other input terminal connected to a second internal selection signal, for providing a given voltage to the gate terminals of the precharge transistor pair, in response to an output of said second device and said second internal selection signal.

3. The failed cell repair circuit as claimed in claim 2, wherein said first device is a NOR gate, said second device is an inverter, and said third device is a NAND gate.

4. The failed cell repair circuit as claimed in claim 3, wherein said one input of said NOR gate is a column address decoding signal.

* * * * *

UNITED STATES PATENT AND TRADEMARK OFFICE
CERTIFICATE OF CORRECTION

PATENT NO.    : 5,703,816
DATED         : December 30, 1997
INVENTOR(S)   : Nam et al.

Page 1 of 1

It is certified that error appears in the above-identified patent and that said Letters Patent is hereby corrected as shown below:

Column 1,
Line 27, "can be traced" should read -- can be traced --.
Line 65, "e.g. FI 1" should read -- e.g. F11 --.

Column 2,
Line 37, "remains in met" should read -- remain intact --.
Line 59, "may he" should read -- may be --.

Column 3,
Line 24, "to he as" should read -- to be as --.
Line 37, "fist inverter" should read -- first inverter --.

Column 4,
Line 33, "should he noted" should read -- should be noted --.
Lines 39, 40, 47, 49 and 53, "he" should read -- be --.
Line 46, "will been" should read -- will be --.

Column 5,
Line 14, "circuit rams cuts" should read -- circuit turns cuts --.

Column 6,
Line 33, "of said bit line pair in unit of column direction," should read -- of said access transistors, and a plurality of precharge transister pairs for precharging said bit line pair in unit of column direction, --.

Signed and Sealed this

Twenty-ninth Day of October, 2002

*Attest:*

*Attesting Officer*

JAMES E. ROGAN
*Director of the United States Patent and Trademark Office*